US008860052B2

(12) United States Patent
Kim et al.

(10) Patent No.: US 8,860,052 B2
(45) Date of Patent: Oct. 14, 2014

(54) LIGHT EMITTING DEVICE

(75) Inventors: Kyung Jun Kim, Hwaseong-si (KR); Chul Ho Park, Uijeongbu-si (KR)

(73) Assignee: LG Innotek Co., Ltd., Seoul (KR)

( * ) Notice: Subject to any disclaimer, the term of this patent is extended or adjusted under 35 U.S.C. 154(b) by 501 days.

(21) Appl. No.: 12/648,118

(22) Filed: Dec. 28, 2009

(65) Prior Publication Data

US 2010/0219435 A1 Sep. 2, 2010

(30) Foreign Application Priority Data

Mar. 2, 2009 (KR) ........................ 10-2009-0017732

(51) Int. Cl.
*H01L 33/00* (2010.01)
*H01L 33/50* (2010.01)
*H01L 33/44* (2010.01)

(52) U.S. Cl.
CPC ................ *H01L 33/50* (2013.01); *H01L 33/44* (2013.01)
USPC .......................................................... 257/98

(58) Field of Classification Search
CPC ....... H01L 33/44; H01L 33/50; H01L 33/501; H01L 33/502; H01L 33/504; H01L 33/52; H01L 33/54; H01L 33/58
USPC .......................................................... 257/98
See application file for complete search history.

(56) References Cited

U.S. PATENT DOCUMENTS

| | | | | |
|---|---|---|---|---|
| 6,734,465 B1 * | 5/2004 | Taskar et al. | ...................... | 257/80 |
| 6,869,813 B2 * | 3/2005 | Okazaki | .......................... | 438/22 |
| 2002/0088985 A1 * | 7/2002 | Komoto et al. | .................. | 257/99 |
| 2004/0070338 A1 | 4/2004 | Noguchi et al. | | |
| 2005/0117357 A1 | 6/2005 | Ishii et al. | | |
| 2006/0094137 A1 * | 5/2006 | Yan | ................................. | 438/21 |
| 2006/0121371 A1 * | 6/2006 | Wu | ................................... | 430/7 |
| 2007/0034887 A1 * | 2/2007 | Pang et al. | ...................... | 257/98 |
| 2007/0269586 A1 * | 11/2007 | Leatherdale et al. | ........... | 427/66 |
| 2009/0267085 A1 * | 10/2009 | Lee et al. | ......................... | 257/88 |

FOREIGN PATENT DOCUMENTS

| | | |
|---|---|---|
| CN | 1419300 | 5/2003 |
| CN | 1497747 | 5/2004 |
| CN | 1913188 | 2/2007 |
| CN | 101253637 A | 8/2008 |
| EP | 1408559 A2 | 4/2004 |
| JP | 11-145519 A | 5/1999 |
| JP | 2004-031003 | 1/2004 |
| JP | 2005-56885 A | 3/2005 |
| JP | 2006-222297 | 8/2006 |
| JP | 2007-173547 | 7/2007 |
| JP | 2008-235827 A | 10/2008 |
| WO | WO 2006/059828 | 6/2006 |
| WO | WO 2007/125493 | 11/2007 |

OTHER PUBLICATIONS

European Office Action mailed May 15, 2013 for EP Application No. 10 154 371.8.
Chinese Office Action and Search Report dated Jun. 23, 2014, issued in Application No. 201010125218.1.

* cited by examiner

*Primary Examiner* — Shaun Campbell
(74) *Attorney, Agent, or Firm* — Birch, Stewart, Kolasch & Birch, LLP

(57) ABSTRACT

Provided is a light emitting device. The light emitting device comprises a body, a light emitting diode on the body, a resin layer on the light emitting diode, and a primer layer containing a metal material on the resin layer.

22 Claims, 7 Drawing Sheets

LIGHT EMITTING DEVICE

CROSS-REFERENCE TO RELATED APPLICATIONS

This application claims priority under 35 U.S.C. 119 to Korean Patent Application No. 10-2009-0017732 filed on Mar. 2, 2009, which is hereby incorporated by reference in its entirety.

BACKGROUND OF THE INVENTION

1. Field of the Invention

Embodiments of the invention relate to a light emitting device.

2. Discussion of the Related Art

Light emitting devices are now actively being researched and developed. Considering various application fields of these light emitting devices, development of a white light emitting device may become an important issue. This is so because a color filter may be adopted to a light emitting device having sufficient brightness, luminous efficiency, device lifetime, and chromaticity to manufacture high-resolution full color displays, and also, the light emitting device may be utilized as a white light source for a backlight and a lighting.

Light emitting diodes (LEDs) are a kind of a semiconductor device used for converting electricity into infrared or visible light using characteristics of a compound semiconductor to transmit and receive signals or to use as light sources. Thus, light of various colors may be emitted using LED chips. Therefore, the LEDs are being used as light sources in various fields.

SUMMARY OF THE INVENTION

Embodiments of the invention provide a light emitting device including a primer layer changing chromaticity coordinate distribution of a light emitting diode on a resin.

Embodiments of the invention provide a light emitting device including a primer layer containing a metal material on a resin layer.

Embodiments of the invention provide a light emitting device that is adjustable to chromaticity coordinate distribution according to a thickness of a primer layer between a resin layer and an optical member.

An embodiment of the invention provides a light emitting device including: a body; a light emitting diode on the body; a resin layer on the light emitting diode; and a primer layer containing a metal material on the resin layer.

An embodiment of the invention provides a light emitting device package including: a body; a light emitting diode on the body; a resin layer on the light emitting diode; and a primer layer which shifts a chromaticity coordinate distribution of light emitted from the light emitting diode disposed on the resin layer.

An embodiment provides a light emitting device including: a body including a plurality of cavities; a plurality of lead electrodes in the respective cavities; a plurality of light emitting diodes in the cavities, respectively; a plurality of resin layers on the light emitting diodes, respectively; and a primer layer containing a metal material on the resin layers, respectively.

The details of one or more embodiments are set forth in the accompanying drawings and the description below. Other features will be apparent from the description and drawings, and from the claims.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

In the descriptions of embodiments of the invention, it will be understood that when a layer (or film), a region, a pattern, or a structure is referred to as being 'on' or 'under' substrate, each layer (or film), a region, a pad, or patterns, it can be directly on substrate each layer (or film), the region, the pad, or the patterns, or intervening layers may also be present.

Hereinafter, a light emitting device according to embodiments of the invention will be described with reference to the accompanying drawings.

Figure 1:
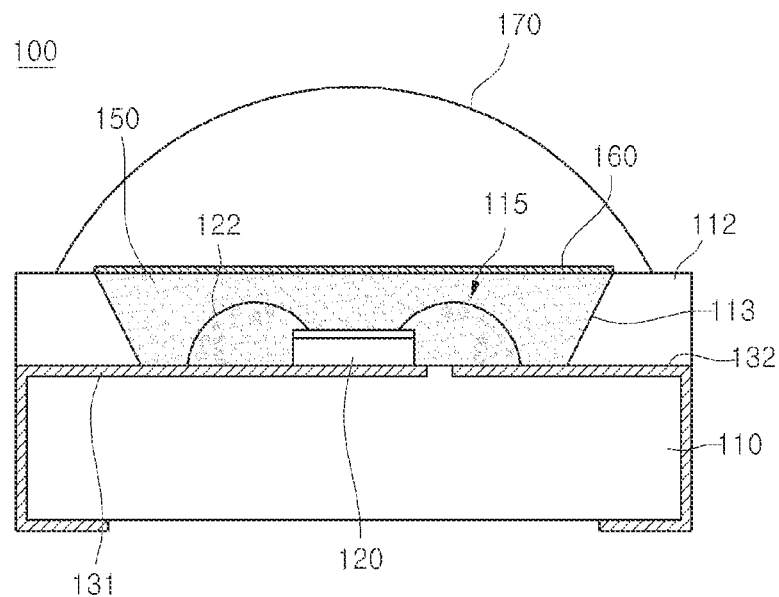
FIG. 1 is a sectional view of a light emitting device according to a first embodiment of the invention.

FIG. 1 is a sectional view of a light emitting device according to an embodiment of the invention.

Referring to FIG. 1, a light emitting device 100 includes a body 110, a cavity 115, a light emitting diode 120, lead electrodes 131 and 132, a resin layer 150, a primer layer 160, and a lens 170.

The body 110 includes a board formed of a resin Material, a ceramic material, or a silicon material. The lead electrodes 131 and 132 may be disposed in the body 110, and the electrodes 131 and 132 may be one of a printed circuit board (PCB) type, a ceramic type, a lead frame type, and a plating type. For convenience of description, the lead frame type electrode will be described below in the following embodiments as an example, and this may be varied within the technical scope of an embodiment of the invention. The body 110 may be integrally injection-molded with an upper body 112 defining the cavity 115, or may be stacked with the upper body 112 to form a stack structure.

A plurality of lead electrodes 131 and 132 is disposed inside the body 110. A cavity 115 having a predetermined depth is defined inside the upper body 112. The cavity 115 may have a polygonal shape or a circular shape, but is not limited thereto. A lateral surface 113 of the cavity 115 may be perpendicular, or inclined with respect to a bottom surface thereof, for example, as shown in FIG. 1. The cavity 115 may include a multi-layered cavity. For example, an additional inner cavity may be disposed inside the cavity 115. A resin layer may be disposed on a surface of the inner cavity.

A portion of the bottom surface of the cavity 115 is exposed through the plurality of lead electrodes 131 and 132 to form an open structure. The light emitting diode 120 is disposed on one lead electrode 131 of the plurality of lead electrodes 131 and 132. The light emitting diode 120 may be selectively connected to the plurality of lead electrodes 131 and 132 using a wire bonding, die bonding, or a flip chip method, but is not limited thereto.

Portions of the lead electrodes 131 and 132 extending away from the cavity 115 may be exposed toward the outside of the body 110, or extend up to a portion of a back surface of the body 110 along an outer surface of the body 110.

At least one light emitting diode 120 may be disposed inside the cavity 115. The light emitting diode 120 may include a colored LED such as a blue LED, a red LED, and a green LED or an ultraviolet (UV) LED, but is not limited thereto.

The resin layer 150 is disposed in the cavity 115. A transparent resin material or phosphor may be added to the resin layer 150. The resin layer 150 may be formed of silicon or an epoxy. The phosphor may include at least one of a red phosphor, a green phosphor, a blue phosphor, and a yellow phosphor.

A top surface of the resin layer 150 may have a flat shape, a concave shape, or a convex shape, but is not limited thereto.

Here, when target light (or a desired output of light) of the light emitting device 100 is white light and the light emitting diode 120 is the blue LED, phosphor for emitting yellow light may be added as the phosphor. Kinds of the light emitting diode 120 and the phosphor may be changed according to a desired target light. Hereinafter, the resin layer 150 to which the phosphor is added will be described in the following embodiments.

In the light emitting device 100, light distribution in CIE chromaticity coordinates is determined according to optical characteristics of the light emitting diode 120 and uniformity of the phosphor added to the resin layer 150. In this case, the light distribution is determined according to conditions such as the optical characteristics of the light emitting diode 120 and a dispensing amount of the phosphor, and relatively wide light distribution is obtained. As a result, in the light emitting device 100, the lens 170 is disposed on the cavity 15 to improve orientation angles and brightness characteristics.

The lens 170 is formed of a resin material such as silicon or an epoxy. Since the lens 170 formed of the resin material does not have an adhesive property, a separate adhesion process is performed to adhere the lens 170 to the body 110. An uneven pattern may be formed on a surface of the lens 170. According to this embodiment, an optical member may adhere to the primer layer 160, and the optical member may include a waveguide plate or a convex lens.

The primer layer 160 is disposed on a surface of the resin layer 150, i.e., a surface of the body 110 to adhere to the lens 170. The primer layer 160 may be disposed on an entire surface of the body 110 or have a size corresponding to that of a bottom surface of the lens 170. Also, the primer layer 160 may be disposed on a top surface of the resin layer 150. That is, the size of the primer layer 160 may be varied according to a size of the lens 170. The primer layer 160 may be formed in an adhesive layer.

The primer layer 160 may be formed of a compound of a rubber material and a metal (or conductive) material. The rubber material may include silicon, an epoxy, and an acrylic material, and the metal material may selectively include or contain carbon (C), iron (Fe), aluminium (Al), silver (Ag), gold (Au), titanium (Ti), zinc (Zn), and tin (Sn). The metal material has a color sensation such as a red-group color and a yellow-group color. The rubber material has an adhesive property, and the primer layer may be realized as an adhesive layer.

Since the primer layer 160 contains the metal material, a color sensation of the primer layer 160 may be finely changed (shifted or calibrated) according to a thickness thereof. That is, chromaticity coordinates of light emitted through the resin layer 150 may be finely changed. The primer layer 160 may shift chromaticity coordinates of light emitted from the light emitting diode 120 from one rank to another rank. Also, the primer layer 160 may shift the chromaticity coordinates of the light emitted from the resin layer 150 from one rank to another rank.

The primer layer 160 may change chromaticity coordinates of the light emitting device 100. For example, when the light emitting device 100 has chromaticity coordinate distribution out (or outside) of a target region, the primer layer 160 may shift the chromaticity coordinate distribution of the light emitting device 100 to (or within) the target region.

Also, the light emitting diode 120 may have the target rank or other target ranks out of the target ranks. Although the light emitting diode 120 has the other target rank out of the target ranks, the primer layer 160 may shift the chromaticity coordinate distribution that is out (or outside) of the target region to chromaticity coordinate distribution to (or within) the target region. Thus, utilization yield may be improved.

The rank represents or refers to a region in which optical characteristics of each of light emitting diodes are subdivided and classified based on chromaticity coordinates, a peak wavelength, and a main wavelength, or a region in which the optical characteristics of the light emitting diode 120 are subdivided based on chromaticity and/or brightness.

The primer layer 160 may be color-complementary to the chromaticity coordinates of the light emitted through the resin layer 150, or the primer layer 160 and the resin layer 150 may have color distributions opposite to each other about the target region.

The lens 170 adheres to a top surface of the primer layer 160 to complete a package. The lens 170 may include a convex lens or a side emitting lens, but is not limited thereto.

Since a chromaticity coordinate distribution of the package is changed using the primer layer 160 adhering to the resin layer 150, utilization yield of the light emitting diode 120 or the package may be improved.

FIGS. 2 to 6 are views illustrating a process of fabricating the light emitting device of FIG. 1.

Figure 2:
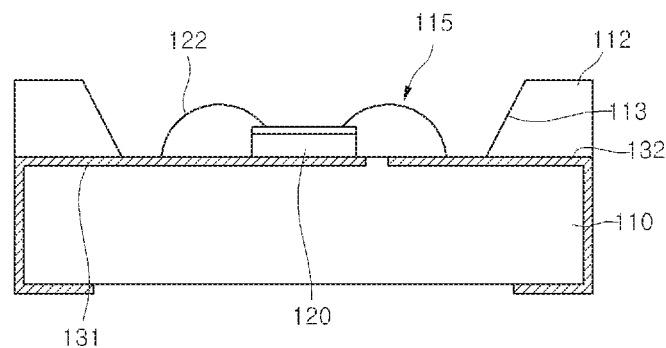
FIGS. 2 to 6 are views illustrating a process of fabricating the light emitting device of FIG. 1.

Referring to FIG. 2, a cavity 115 is formed in an upper portion 112 of a body 110. A plurality of lead electrodes 131 and 132 is disposed in the cavity 115.

A light emitting diode 120 is electrically connected to the plurality of lead electrodes 131 and 132. The light emitting diode 120 may be connected to the plurality of lead electrode 131 and 132 using a wire 122, a flip chip, or a die bonding method according to a kind of chips.

The light emitting diode 120 may include a colored LED such as a blue LED, a red LED, a green LED and/or an ultraviolet (UV) LED. Also, a plurality of LEDs may be disposed in the cavity 115. The plurality of LEDs may emit light having the same color or light having colors different from each other.

Here, the body 110 includes a substrate formed of a resin material, a ceramic material, or a silicon material. The lead electrodes 131 and 132 may be formed in the body 110, and may be one of a PCB type, a ceramic type, a lead frame type, and a plating type.

The other ends of the lead electrodes 131 and 132 are exposed to the outside of the body 110 and may be used as external terminals.

The body 110 and the upper portion 112 of the body 110 may be formed of the same material or materials different from each other.

Figure 3:
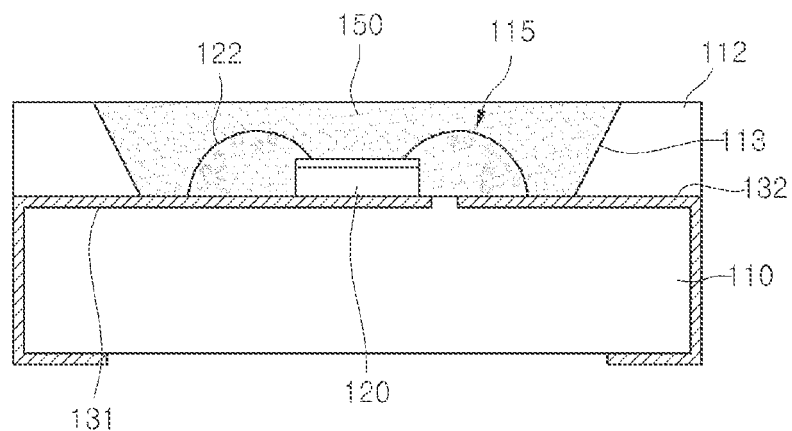

Referring to FIG. 3, a resin layer 150 is formed in the cavity 115. A transparent resin material or phosphor may be added to the resin layer 150. The resin layer 150 may be formed of silicon or an epoxy. The phosphor may include at least one of a red phosphor, a green phosphor, a blue phosphor, and a yellow phosphor.

Here, when the light emitting diode 120 includes the blue LED, phosphor for emitting yellow light may be added as the phosphor. Kinds of the light emitting diode 120 and the phosphor may be changed according to (or to obtain) a target light. Hereinafter, the resin layer 150 to which the phosphor is added will be described in the following embodiments.

Light distribution in CIE chromaticity coordinates is determined according to optical characteristics of the light emitting diode 120 and uniformity of the phosphor added to the resin layer 150.

Figure 4:
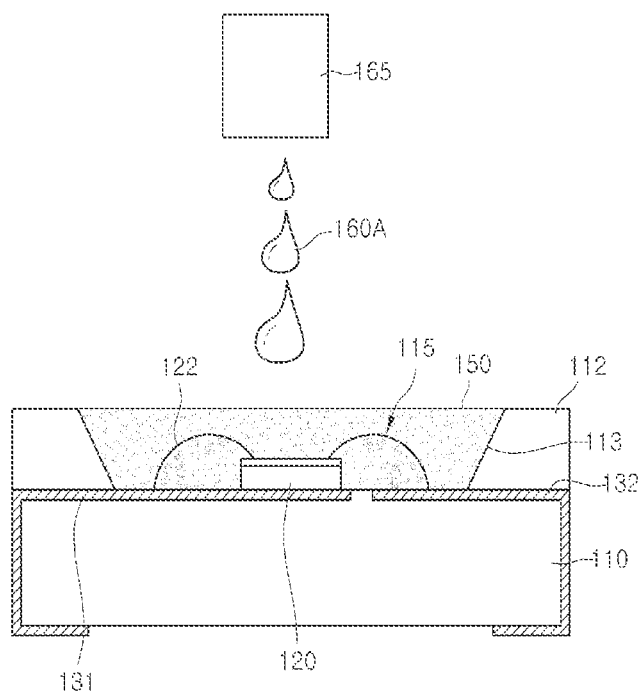
Figure 5:
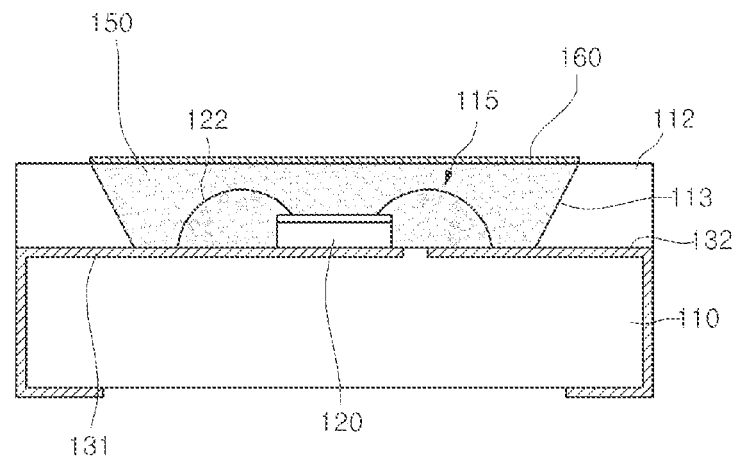

Referring to FIGS. 4 and 5, a primer layer 160 is coated on a top surface of the resin layer 150. The primer layer 160 may be disposed on an entire surface of the body 110 or have a size corresponding to that of a bottom surface of the lens 170. Also, the primer layer 160 may be disposed on a top surface of the resin layer 150. That is, a coated region of the primer layer 160 may be varied according to a size of the lens 170.

The primer layer 160 may be formed of a compound of a rubber material and a metal material. The rubber material may include silicon, an epoxy, and an acrylic material, and the metal (or a conductive) material may selectively include or contain C, Fe, Al, Ag, Au, Ti, Zn, and Sn. The metal material has color sensation such as a red-group color and a yellow-group color.

Also, since the primer layer 160 contains the metal material, a color sensation of the primer layer 160 may be finely changed (shifted or calibrated) according to a thickness thereof. That is, chromaticity coordinates of light emitted through the resin layer 150 may be finely changed. Also, the primer layer 160 may shift the chromaticity coordinates of the light emitted from the resin layer 150 to other ranks.

A predetermined amount of a primer may be injected using a dispensing device 165 to form the primer layer 160 on a top surface of the resin layer 150. The dispensing device 165 uses a PicoDot jet dispensing system, for example, but other injection or dispensing system or technique may be used.

The primer 160A is dispensed using the dispensing device 165. At this time, the dispensing amount may be adjusted within a range of from about 20 dotting to about 60 dotting. Here, since the dispensing amount of about 20 dotting does not affect color, the dispensing amount in embodiments may be adjusted to about 20 dotting or more.

Also, the primer 160A may be controlled to a dispensing amount in terms of a unit of a nanoliter per one dot, e.g., 2 nanoliters. The dispensing amount controlled in terms of the nanoliter unit may finely change a thickness of the primer layer 160. In this case, a thickness change of the primer layer 160 containing a metal material having a color sensation may finely change a chromaticity coordinate distribution of light emitted through the resin layer 150 having a color sensation. The primer layer 160 may have a thickness of about 50 um or less.

The primer layer 160 may change a chromaticity coordinate distribution of light emitted from the light emitting diode 120 and the light emitted through the resin layer 150. When light emitted from the light emitting diode 120 and the resin layer 150 is out (or outside) of chromaticity coordinates of a target region, the primer layer 160 may shift the chromaticity coordinate distribution of the light emitted from the light emitting device 100 or the resin layer 150 to the chromaticity coordinates of the (or within) the target region.

Thus, the light emitting diode 120 may use a rank out of a target rank, and the primer layer 160 may shift a rank of the light emitting diode 120 to the chromaticity coordinate distribution of the target rank. At this time, the primer layer 160 may be color-complementary to the chromaticity coordinates of the light emitted through the resin layer 150, or the primer layer 160 and the resin layer 150 may have color distributions opposite to each other about the target region. Thus, the light emitting diode 120 may use the target rank and an available rank therearound to improve utilization yield.

Figure 6:
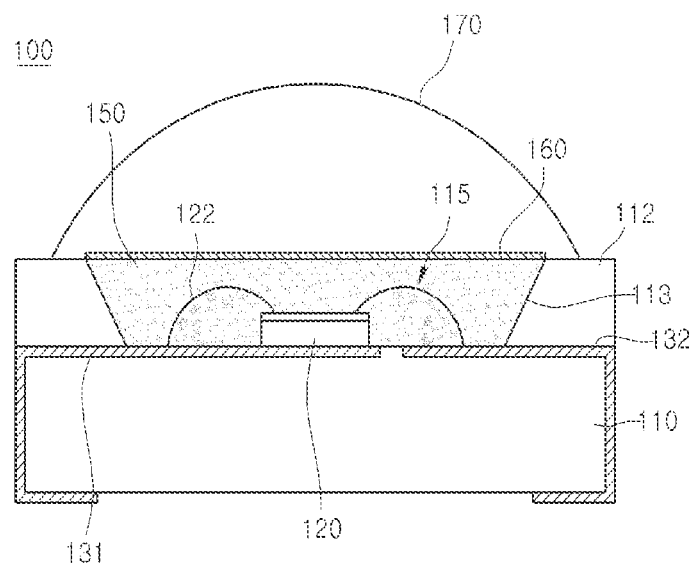

Referring to FIG. 6, the lens 170 adheres to a top surface of the primer layer 160 to complete a package. The lens 170 may include a convex lens or a side emitting lens, but is not limited thereto.

The lens 170 may improve orientation angles and brightness characteristics of the light emitting device 100. The lens 170 is formed of a resin material such as silicon or an epoxy. Since the lens 170 formed of the resin material does not have an adhesive property, a separate adhesion process using the primer layer 160 may be performed to adhere the lens 170 to the body 110.

Since a chromaticity coordinate distribution of the package is changed using the primer layer 160 adhering to the resin layer 150, a utilization yield of the light emitting diode 120 and the package may be improved.

In the method of fabricating the light emitting device 100, the resin layer 150 is formed in the cavity 115 of the body 110. In this state, distribution of light emitted through the resin layer 150 may be measured to construct a color-sorting table according to light distribution characteristics of each of packages. A group out of the target rank may be designated using the color-sorting table, and then, a dotting amount of a primer corresponding to the designated group may be determined.

That is to say, when the light emitting diode 120 having a rank out (or outside) of the target rank is used, light distributions on the resin layer 150 may be respectively measured, and then, a primer may be dotted with an amount proportional to each of light distributions of the light emitting diode 120 to move or shift the light distribution to within the target region.

Figure 7:
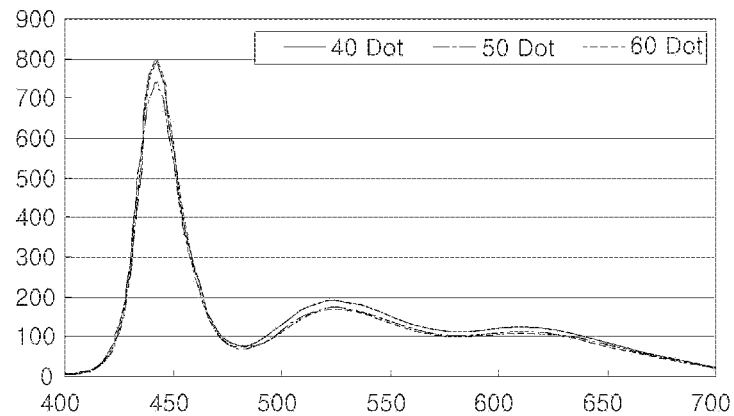
FIG. 7 is a graph illustrating a wavelength change according to a dotting amount of a primer according to an embodiment of the invention.

FIG. 7 is a graph illustrating a wavelength change according to a dotting amount of a primer according to an embodiment of the invention.

Referring to FIG. 7, a wavelength X and a luminous intensity Y according to a dotting amount of a primer are finely changed. Here, a light emitting diode emits light having a blue peak wavelength (X-axis: 450 nm), and a phosphor emits yellow light (X-axis: 525 nm). The light emitted from the light emitting diode and the phosphor may be finely changed according to the dotting amount or a thickness of the primer.

Figure 8:
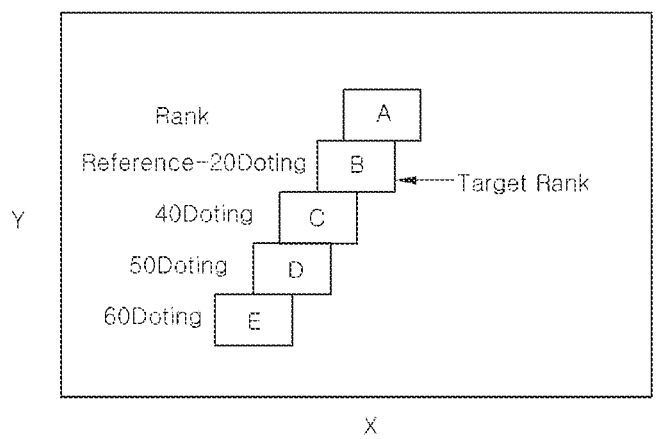
FIG. 8 is a view illustrating a change of a CIE value depending on an increase of a dotting amount of a primer according to an embodiment of the invention.

FIG. 8 is a view illustrating a change of a CIE value depending on an increase of a dotting amount of a primer according to an embodiment of the invention.

Referring to FIG. 8, a chromaticity B rank of chromaticity A through E ranks of a light emitting device represents a target rank. In this case, since the primer of about 20 dotting does not affect color, it may be set to a reference dotting amount.

As a dotting amount of the primer gradually increases to about 40 dotting, about 50 dotting, and about 60 dotting, a chromaticity rank of a package may be changed to C, D, and E, respectively. Here, the rank may be a region in which optical characteristics are subdivided based on chromaticity after the resin layer is formed.

Also, the resin layer is formed in the cavity 115. In this state, light distribution of each package is measured to construct a color-sorting table according to light distribution characteristics of the each of packages. Thereafter, groups (i.e., C, D, and E) out of the target rank (i.e., B) may be designated using the color-sorting table, and then, a dotting amount of a primer corresponding to the designated group may be determined. That is, B, C, D, and E may dispense about 20 dotting amount, about 40 dotting amount, about 50 dotting amount, and about 60 dotting amount, respectively, to adjust a chromaticity rank of respective groups.

Figure 9:
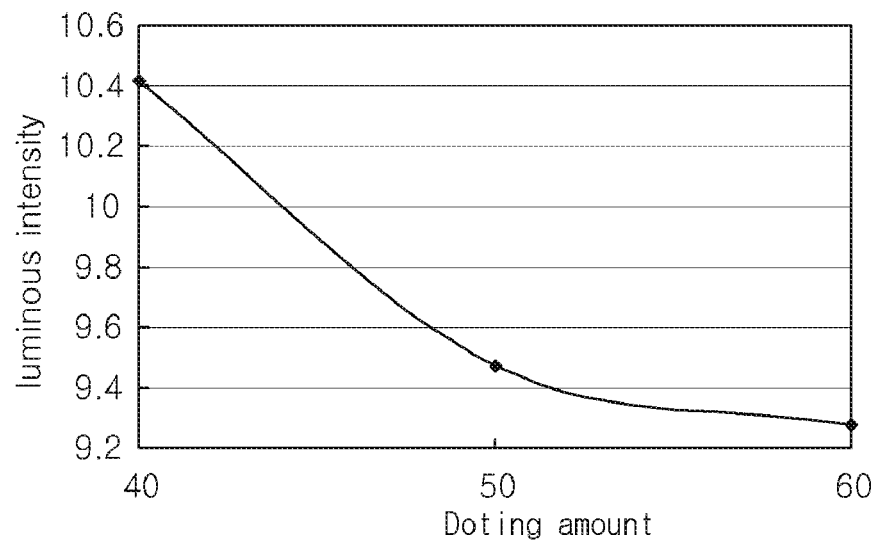
FIG. 9 is a graph illustrating changes of a dotting amount of a primer and a luminous intensity in a light emitting device according to an embodiment of the invention.
Figure 10:
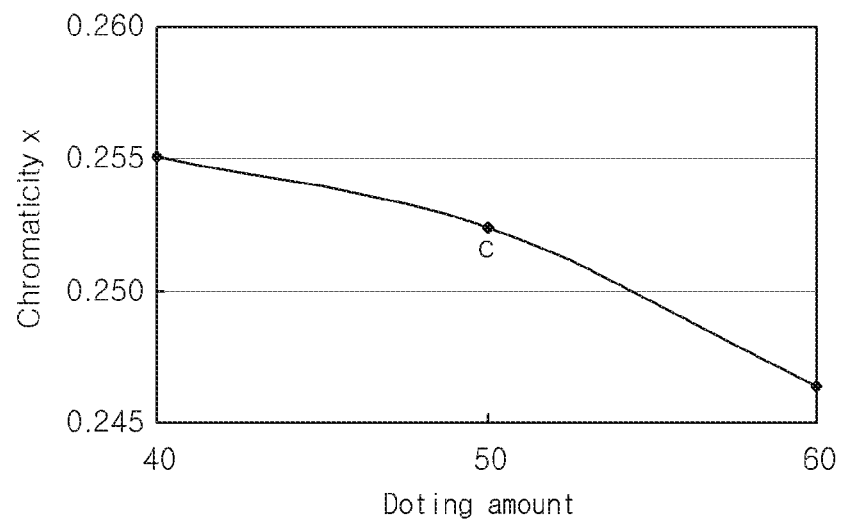
FIG. 10 is a graph illustrating changes of a dotting amount of a primer and chromaticity coordinate x in a light emitting device according to an embodiment of the invention.
Figure 11:
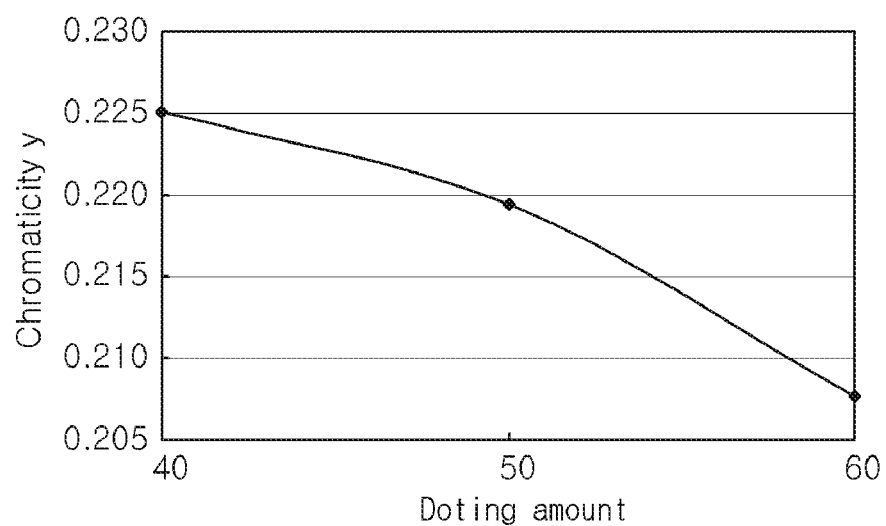
FIG. 11 is a graph illustrating changes of a dotting amount of a primer and chromaticity coordinate y in a light emitting device according to an embodiment of the invention.

FIGS. 9 to 11 are graphs illustrating changes of light characteristics according to the number of dotting of a primer. FIG. 9 is a graph illustrating a change of a luminous intensity, FIG. 10 is a graph illustrating a change of a chromaticity coordinate x, and FIG. 11 is a graph illustrating a change of a chromaticity coordinate y.

Referring to FIGS. 9 to 11, when a dotting amount of a primer increases from about 40 dotting to about 60 dotting, it is seen that a luminous intensity and chromaticity coordinates x and y gradually decrease.

Figure 12:
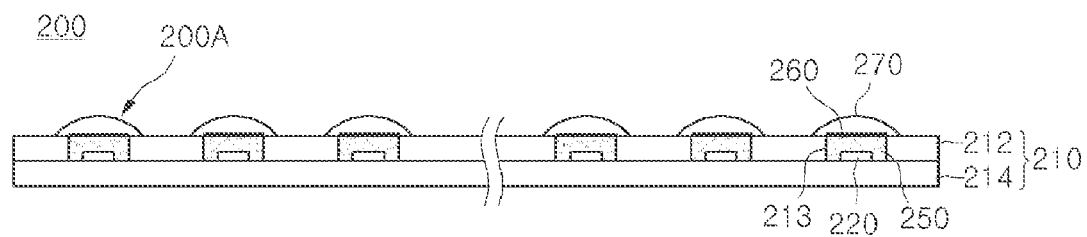
FIG. 12 is a sectional view of a light emitting device according to an embodiment of the invention.
Figure 13:
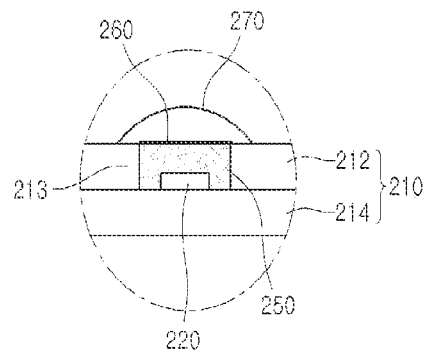
FIG. 13 is a partially enlarged view of FIG. 12.

FIG. 12 is a sectional view of a light emitting device according to another embodiment, and FIG. 13 is a partially enlarged view of FIG. 12.

Referring to FIGS. 12 and 13, a light emitting device 200 may be a module in which a plurality of light emitting parts 200A is arrayed. The light emitting device 200 includes a module board 210, a cavity 213, a light emitting diode 220, a resin layer 250, a primer layer 260, and a lens 270.

The module board 210 includes a board 212 and a reflective layer 214. The board 212 may include a flexible PCB, a metal PCB, and a general PCB. Also, the board 212 may be used as bodies of the respective light emitting parts 200A. The reflective layer 214 may be integrally attached to the board 212 using a laminating or a pressing method. The module board 210 may serve as a body, but is not limited thereto.

When the module board 210 includes a multi-layered board, the cavity 213 may be defined on the reflective layer 214, but is not limited thereto. Also, an optical sheet may be disposed on the module board 210, but is not limited thereto.

A plurality of cavities 213 may be arrayed by a predetermined distance on the module board 210. The light emitting diode 220 may be electrically connected to a lead electrode disposed on the board 212. The light emitting diode 220 may be mounted using one of flip chip, die bonding, and wire bonding methods, but are not limited thereto.

The cavities 213 of the module board 210 may be arrayed in at least one line by a predetermined distance. Alternately, a plurality of rows may be arrayed in a matrix shape or a zigzag shape, but is not limited thereto.

A surface of the cavity 213 may have a circular shape or a polygonal shape, but is not limited thereto.

The light emitting diode 220 disposed in the cavity 213 may include at least one of a colored LED such as a red LED, a green LED, a blue LED and/or an ultraviolet (UV) LED.

The resin layer 250 is disposed in the cavity 213. Phosphor may be added to a resin material such as silicon or an epoxy to form the resin layer 250. The phosphor may be selected in consideration of a relation between light of the light emitting diode 250 and target light.

Here, the light emitting module 200 may realize white light using a blue LED chip and a yellow LED chip or a dual LED chip.

A top surface of the resin layer 250 may have a flat shape, a concave shape, or a convex shape, but is not limited thereto.

The primer layer 260 may be disposed on the resin layer 250. The primer layer 260 may be formed of rubber materials (silicon or an acrylic material) and a compound of metals. The rubber materials may include silicon and an acrylic material, and the metals may selectively include C, Fe, Al, Ag, Au, Ti, Zn, and Sn. The metal material has a color sensation, such as a red-group color and a yellow-group color.

The primer layer 260 may be formed by dispensing the primer within a range of from about 20 dotting to about 60 dotting. Also, the primer may be controlled to a dispensing amount in terms of a unit of a nanoliter (e.g., 2 nanoliters) per one dot. The light distribution at each of the light emitting parts 200A may be changed to or within the target region by controlling a thickness of the primer layer 260.

For example, when the light emitting diode 220 may use an LED having a rank out of a target rank, the chromaticity coordinate distribution may be changed using the primer layer 260. Thus, the utilization yield of the light emitting diode 220 may be improved.

The lens 270 adheres to the resin layer 250 using the primer layer 260. The lens 270 may include a convex lens or a side emitting lens, but is not limited thereto. Here, an optical member may be disposed on the module board 210. The optical member may include a waveguide plate, an optical sheet, and/or a lens. The optical member may adhere to the resin layer 250 using the primer layer 260.

When chromaticity coordinate distribution of the respective light emitting parts 200A or all of the light emitting parts 200A is out of the target region, the chromaticity coordinate distribution may be moved to the target region using the primer layer 260 having color sensation, and being disposed on the resin layer 250.

The light emitting module 200 may be selectively applicable to a direct-view type light unit and a side-view type light unit. In addition, the light emitting module 200 may be applicable to portable terminals, various indication devices, and display devices.

References to color sensation may refer to one of perceivable color, and may be one based on the CIE chromaticity coordinates, but is not limited thereto.

In still another embodiment, a fabrication method of a light emitting device includes: disposing a light emitting diode on a body; forming a resin layer on the light emitting diode; forming a primer layer containing a metal material on the resin layer; and attaching an optical member to the primer layer.

Embodiments of the invention may improve the utilization yield of the light emitting diode.

Embodiments of the invention may improve the utilization yield of the package or module including the light emitting diode.

According to the embodiments of the invention, the color distribution of the LED package or light emitting module may be moved (or shifted) to (or within) the target region.

Embodiments of the invention may improve the utilization yield of the LED chip.

Embodiments of the invention may improve the utilization yield of the LED package.

Embodiments of the invention may improve the utilization yield of the light emitting module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments of the invention.

Although embodiments of the invention have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/oz arrangements, alternative uses will also be apparent to those skilled in the art.

What is claimed is:

1. A light emitting device, comprising:
   a body;
   a light emitting diode on a first top surface of the body;
   a first layer on the light emitting diode and comprising phosphor; and
   a second layer on only a top surface of the first layer, the second layer having a single layer containing a compound of a rubber material and a metal material,
   a lens directly contacting a top surface and a side surface of the second layer,
   wherein the metal material has a color sensation of a colored group for shifting a chromaticity coordinate of light emitted from the light emitting diode.

2. The light emitting device according to claim 1, further comprising:
   a cavity in which the first layer is disposed, the cavity being defined in the body; and
   at least one lead electrode extending within the cavity,
   wherein the light emitting diode is electrically connected to the at least one lead electrode within the cavity.

3. The light emitting device according to claim 1, wherein the metal material contains at least one of carbon (C), iron (Fe), aluminium (Al), silver (Ag), gold (Au), titanium (Ti), zinc (Zn), and tin (Sn).

4. The light emitting device according to claim 1, wherein the phosphor comprises at least one of a red phosphor, a green phosphor, a blue phosphor, and a yellow phosphor.

5. The light emitting device according to claim 1, wherein the body is formed of at least one of a resin material, a ceramic material, and a silicon material.

6. The light emitting device according to claim 1, wherein the light emitting diode (LED) comprises at least one of a red LED, a blue LED, a green LED, and an ultraviolet (UV) LED.

7. The light emitting device according to claim 1, wherein the second layer has a thickness of about 50 um or less.

8. The light emitting device according to claim 2, wherein the body defines a plurality of cavities.

9. A light emitting device, comprising:
   a body;
   a light emitting diode on a first top surface of the body;
   a first layer on the light emitting diode and comprising phosphor;
   a second layer on only a top surface of the first layer and having a single layer containing a compound of a rubber material and a metal material for shifting a chromaticity coordinate distribution of light emitted from the light emitting diode; and
   an optical member comprising a lens and directly contacting a top surface and a side surface of the second layer and at least a portion of a second top surface of the body,
   wherein the first layer is physically spaced apart from the optical member, and
   wherein a bottom surface of the second layer is higher than at least a top surface of the light emitting diode.

10. The light emitting device according to claim 9, wherein the body comprises a cavity comprising the first layer at an upper portion thereof, and
    a plurality of lead electrodes electrically connected to the light emitting diode in the cavity.

11. The light emitting device according to claim 9, wherein the metal material contains at least one of carbon (C), iron (Fe), aluminium (Al), silver (Ag), gold (Au), titanium (Ti), zinc (Zn), and tin (Sn).

12. The light emitting device according to claim 9, wherein the lens is attached to the first layer by the second layer.

13. The light emitting device according to claim 9, wherein the metal material comprises a material of a red-colored group and a material of a yellow-colored group.

14. The light emitting device according to claim 9, wherein the phosphor comprises at least one of a red phosphor, a green phosphor, a blue phosphor, and a yellow phosphor.

15. The light emitting device according to claim 9, wherein the second layer shifts a rank having a chromaticity coordinate distribution of light emitted from the light emitting diode to another rank having another chromaticity coordinate distribution.

16. The light emitting device according to claim 14, wherein the second layer shifts a rank having a chromaticity coordinate distribution of light emitted from the first layer to another rank having another chromaticity coordinate distribution.

17. A light emitting device, comprising:
    a body comprising a plurality of cavities, the plurality of cavities being spaced apart from each other;
    a plurality of lead electrodes contacting an inner top surface of the body in the respective cavities;
    a plurality of light emitting diodes in the plurality of cavities, respectively;
    a plurality of first layers on the plurality of light emitting diodes, respectively and spaced apart from each other;
    a plurality of second layers on only top surfaces of the plurality of first layers, respectively, each second layer having a single layer containing a compound of a rubber material and metal material; and
    an optical member including a plurality of lenses, each lens directly contacting a top surface and a side surface of the each second layer, respectively,
    wherein the metal material has a color sensation of a colored group for shifting a chromaticity coordinate of light emitted from the light emitting diode, and
    wherein a bottom surface of the second layer is higher than at least a top surface of each light emitting diode.

18. The light emitting device according to claim 17, wherein the plurality of first layers comprises at least one kind of phosphor.

19. The light emitting device according to claim 18, wherein the metal material contains at least one of carbon (C), iron (Fe), aluminium (Al), silver (Ag), gold (Au), titanium (Ti), zinc (Zn), and tin (Sn).

20. The light emitting device according to claim 1, wherein the rubber material includes at least one of silicon, an epoxy, and an acrylic material.

21. The light emitting device according to claim 9, wherein the rubber material includes at least one of silicon, an epoxy, and an acrylic material.

22. The light emitting device according to claim 17, wherein the rubber material includes at least one of silicon, an epoxy, and an acrylic material.

* * * * *